United States Patent [19]

Wu

[11] Patent Number: 5,173,753
[45] Date of Patent: Dec. 22, 1992

[54] INVERTED COPLANAR AMORPHOUS SILICON THIN FILM TRANSISTOR WHICH PROVIDES SMALL CONTACT CAPACITANCE AND RESISTANCE

[75] Inventor: Biing-Seng Wu, Tainan, China

[73] Assignee: Industrial Technology Research Institute, Hsincgu, Taiwan

[21] Appl. No.: 826,674

[22] Filed: Jan. 27, 1992

Related U.S. Application Data

[63] Continuation of Ser. No. 491,679, Mar. 12, 1990, abandoned, which is a continuation-in-part of Ser. No. 392,743, Aug. 10, 1989, abandoned.

[51] Int. Cl.$^5$ .................. H01L 21/336; H01L 29/78; H01L 27/12
[52] U.S. Cl. .................... 257/347; 437/40; 437/101; 437/909; 257/9
[58] Field of Search .............. 437/40, 41, 43, 101, 437/187, 235, 238, 229, 909; 357/23.7, 2, 4

[56] References Cited

U.S. PATENT DOCUMENTS

| | | | |
|---|---|---|---|
| 4,587,720 | 5/1986 | Chenevas-Paule et al. | 437/56 |
| 4,685,195 | 8/1987 | Szydlo et al. | 357/23.7 |
| 4,885,616 | 12/1989 | Ohta | 357/23.7 |
| 4,905,066 | 2/1990 | Dohjo et al. | 357/23.7 |
| 4,928,161 | 5/1990 | Kobayashi | 357/23.7 |
| 4,935,792 | 6/1990 | Tanaka et al. | 357/4 |

FOREIGN PATENT DOCUMENTS

| | | | |
|---|---|---|---|
| 0090661 | 10/1983 | European Pat. Off. | |
| 0304824 | 3/1989 | European Pat. Off. | 357/23.7 |
| 0050564 | 3/1984 | Japan | 437/101 |
| 0030375 | 2/1987 | Japan | |
| 0120074 | 6/1987 | Japan | 437/101 |
| 0221678 | 9/1988 | Japan | 437/101 |
| 0161734 | 6/1990 | Japan | 437/909 |
| 0211636 | 8/1990 | Japan | 437/909 |

OTHER PUBLICATIONS

Wolf et al., *Silicon Processing for the VLSI Era, vol. 1-Process Technology*, Lattice Press, 1986, pp. 581–582.
Griffith L. Resor, "Lithography for Flat Panel Video Displays", Solid State Technology, 1988, 5 pages.
MRS Technology, Inc. Product Specifications Model 4500S PanelPrinter TM, 1 page.

*Primary Examiner*—Mary Wilczewski
*Attorney, Agent, or Firm*—Darby & Darby

[57] ABSTRACT

A process for manufacturing thin film transistors that have small source-drain areas, small gate-source parasitic capacitance $C_{gs}$, and low contact resistance, comprising producing the gate of the transistor on a glass substrate, depositing a gate insulating layer, a thick undoped amorphous silicon layer and a top passivation layer successively on the substrate. The top passivation layer and the thick undoped amorphous silicon layer are then etched until the insulating layer is exposed.

14 Claims, 2 Drawing Sheets

INVERTED COPLANAR AMORPHOUS SILICON THIN FILM TRANSISTOR WHICH PROVIDES SMALL CONTACT CAPACITANCE AND RESISTANCE

This is a continuation of application Ser. No. 491,679, filed Mar. 12, 1990, now abandoned, which is a continuation-in-part of application Ser. No. 392,743, filed Aug. 10, 1989, now abandoned.

BACKGROUND OF THE INVENTION

This invention relates to a process for manufacturing thin film transistors that have small source-drain areas, small gate-source parasitic capacitance $C_{gs}$, and low contact resistance. Such thin film transistors can be used as active matrices for flat panel liquid crystal displays.

Various known techniques for making thin film transistors lead inevitably to an overlap of the transistor gate with the source and drain. This overlap introduces gate-source parasitic capacitance. This capacitance is particularly prejudicial to the operation of thin film transistor made of hydrogenated amorphous silicon, because it increases the response time of the transistors and introduces unacceptable DC voltage levels when the transistors are used in a liquid crystal display device. This parasitic capacitance must consequently be minimized.

A manufacturing process for thin layer transistors has been disclosed in "A Self-Alignment Process for Amorphous Silicon Thin Film Transistors", IEEE Electron Device Letters, Vol. EDL3, No. 7, July, 1982. This process enables the gate of the transistor to be self-aligned with the drain and source to eliminate the overlap capacitance almost entirely. This manufacturing process is too complex, however, to be employed in mass production. A device made by this process is also not "electrically" coplanar, i.e., the channel and the drain and source electrodes of the transistors are not in the same plane. Since the source and drain are in "Schottky contact" with the channel, its "on" current is degraded because of the high series resistance.

Another self-aligned thin film transistor manufacturing process is disclosed in U.S. Pat. No. 4,587,720, "Process for the Manufacture of a Self-Aligned Thin-Film Transistor", Andre Chenvas-Paule and Bernard Diem, May 13, 1986. This process produces a coplanar, ohmic source-drain a-Si TFT. A lift-off method is used to form the source and drain with a channel/n+ a-Si layer ohmic contact. The n+ a-Si layer is grown in a Plasma Enhanced Chemical Vapor Deposition (PECVD) system, thereby necessitating the use of a high temperature photoresist material. Because using PECVD film possesses good step coverage, it will cause difficulty while executing the lift-off process. In other words, the lift-off process for n+ a-Si is hard to achieve and results in a drastically decreased yield of TFT arrays. Therefore, this process cannot be satisfactorily employed in the manufacture of large area flat panel displays.

Furthermore, both of the above methods for manufacturing self-aligned TFT's need a very thin a-Si film, e.g., 20 nm, for exposing the positive photoresist layer to the Hg lamp. Poor uniformity in the thickness of this very thin film causes the yield of large area flat panel displays to decrease drastically.

Recently, a high yield inverted staggered a-Si TFT has been developed by Matsushita Electric Industry Co., Ltd. This process is described in an article in Japan Display, 1986, entitled "12.5" LCD Addressed by a-Si TFT's Employing Redundancy Technology", M. Takeda et al. In this disclosure, an SiN gate insulating layer, an a-Si film active semiconductor and an SiN top passivation layer are successively deposited in the same pumpdown time, using different kinds of gases. This technique is effective in eliminating contamination at the gate insulating layer/a-Si film interface, where the channel region of TFT is formed. The top passivation layer provides a good passivation of the active a-Si film from successive wet processes, and is also used as an autostopper when patterning the source-drain n+ contact layer. Because the channel, the source and the drain are not in the same plane, this kind of device is a staggered TFT. This fabrication method needs a large source-drain contact region, however, to reduce drain-current crowding effect, and hence the parasitic capacitance of a device formed by this method is unavoidably large.

SUMMARY OF THE INVENTION

It is an object of the present invention to provide a thin film transistor that does not have high parasitic capacitance.

Another object of the invention is to provide an inverted coplanar a-Si TFT having the advantages of successive growth of SiN, a-Si and SiN layers, a small source-drain region, a small gate-source capacitance, and low resistance.

Still another object of the invention is to provide a process for producing an electrically inverted coplanar structure in which the channel of the transistor and the drain and source electrodes are situated in the same plane.

Briefly stated, the process steps in accordance with the invention for fabricating an inverted coplanar thin film transistor are:

(a) producing a transistor gate on a substrate of insulating film, e.g., glass or an opaque substrate;

(b) depositing successively a gate insulating layer, a thick a-Si:H film active layer and a top passivation layer on the substrate;

(c) depositing, exposing and developing a photoresist layer to open narrow source and drain windows in the photoresist layer;

(d) etching the top passivation layer until the a-Si:H layer is exposed;

(e) etching the a-Si:H layer until the gate insulating layer is exposed to form narrow source and drain openings in the a-Si:H layer;

(f) removing the remaining photoresist layer;

(g) depositing an n+ a-Si:H film to form narrow ohmic contact regions in the source and drain openings in the a-Si:H layer;

(h) depositing, exposing and developing a photoresist layer for the active region of the transistor;

(i) etching the n+ a-Si:H, the top passivation layer and the a-Si:H layer until the gate insulating layer outside of the active region is exposed;

(j) removing the remaining photoresist layer;

(k) depositing, exposing and developing a photoresist layer for the contact hole of the gate electrode;

(l) etching the gate insulating layer until the gate metal is exposed to form a gate contact hole;

(m) removing the remaining photoresist layer;

(n) depositing contact metal;

(o) depositing, exposing and developing a photoresist layer for the connection of the gate electrode and of the source and drain electrodes;

(p) etching the contact metal to define a metal contact to the gate electrode and source and drain metal contacts and successively etching the n+ a-Si:H layers until the top passivation layer between the source and drain regions is exposed; and finally (q) removing the remaining photoresist layer.

The successive deposition of the gate insulating layer, a-Si:H layer and top passivation layer results in a low defect density in the active layer and good interface properties between the gate insulating layer and the a-Si:H layer. The use of a thick a-Si:H layer enables this layer to have good uniformity. Step (e) permits the forming of an electrically inverted coplanar structure, which removes the undoped a-Si layer between conducting channel and the n+ a-Si:H layer. As a result the source and drain contact area can be very small, thereby providing a device having very low parasitic capacitance.

BRIEF DESCRIPTION OF THE DRAWINGS

In order that the invention may be more clearly understood, it will now be disclosed in greater detail with reference to the accompanying drawings, which are not intended to restrictively represent the invention, wherein.

DETAILED DISCLOSURE OF THE INVENTION

Figure 1:
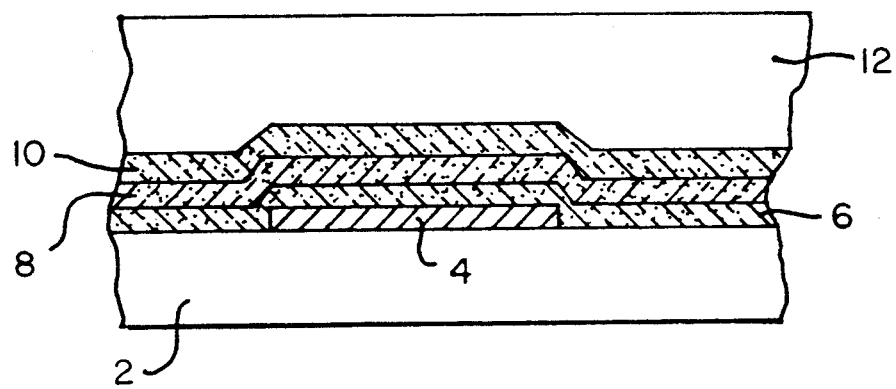
FIG. 1 is a cross-sectional view of the deposition of the gate insulating, a-Si:H and top passivation layers in a first step in accordance with the invention.

As illustrated in FIG. 1, the first step of the process of the invention is comprised of forming gate 4 of the transistor on a glass substrate or other substrate 2, using conventional methods of photolithography such as masking and etching. This gate 4 has a thickness, for example, of 200 nm (2,000 Angstroms), and is preferably made of tantalum.

The gate insulating layer 6, a-Si:H layer 8 and top passivation layer 10 are then deposited successively by the PECVD method in the same pumpdown time. Both the gate insulating layer 6 and the top passivation layer 10 can be silicon nitride or silicon dioxide. The reaction gases for silicon nitride are silane and ammonia, and the reaction gases for silicon dioxide are dinitrogen oxide and silane. The reaction gas for a-Si:H is pure silane. The thickness of the gate insulating layer 6 varies from 200 nm to 300 nm, and that of the active layer 8 varies from 100 nm to 300 nm. The thickness of the top passivation layer 10 is close to 300 nm. Then the photoresist layer 12 is deposited on the passivation layer 10.

Figure 2:
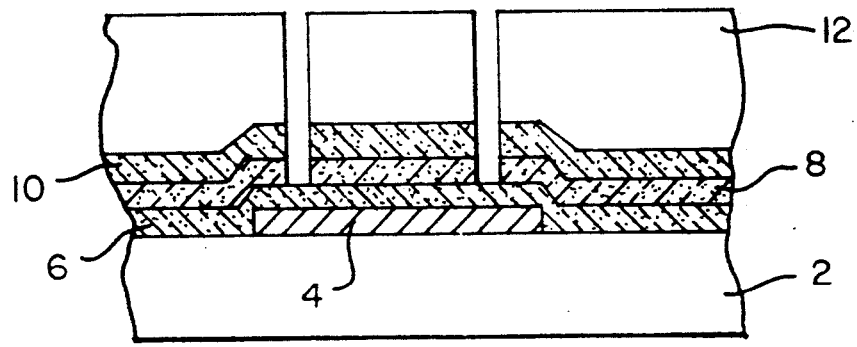
FIG. 2 is a cross-sectional view of the etching of the top passivation layer and a-Si layer in a second step in accordance with the invention.

In the next step, as represented in FIG. 2, the photoresist layer 12 is developed and etched to provide a mask for forming narrow source and drain contacts. The widths of the contacts are as narrow as possible, being limited by the capabilities of the aligner machine and the etching machine. The top passivation layer 10 is etched by dry etching, using plasma of freon 23, with the photoresist layer 12 serving as a mask for this etching step. The a-Si:H layer 8 is etched by dry etching, using a plasma of sulfur hexafluoride. This etching step is stopped when the gate insulating layer 6 is laid bare, i.e. exposed. The photoresist layer 12 is now removed.

It may be seen from FIG. 2 that the openings 30 which are formed extend through the top passivation layer 10 and a-Si:H layer 8 to expose a portion of the gate insulating layer 6. These openings 30 each have an end 32 which faces opposite the top surface 34 of the gate so that a projection of each of the ends onto the top surface is spaced from edges 36 of the gate.

Figure 3:
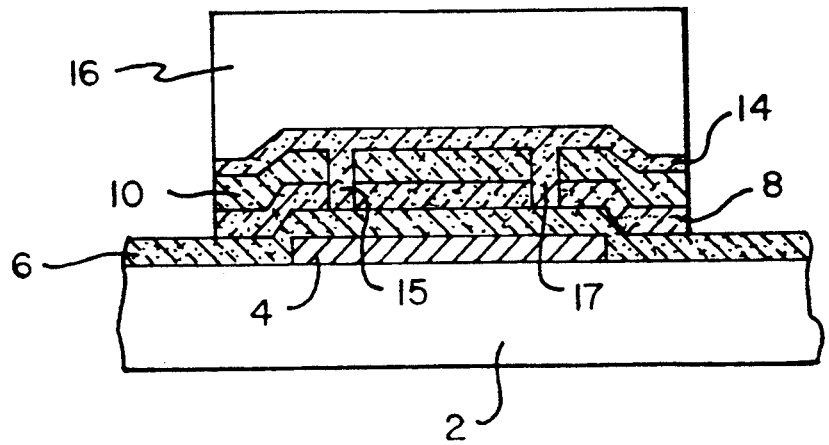
FIG. 3 is a cross-sectional view of the deposition of the n+ a-Si layer and defining the active region (thin oxide region) of the transistor in a third step in accordance with the invention.
Figure 4:
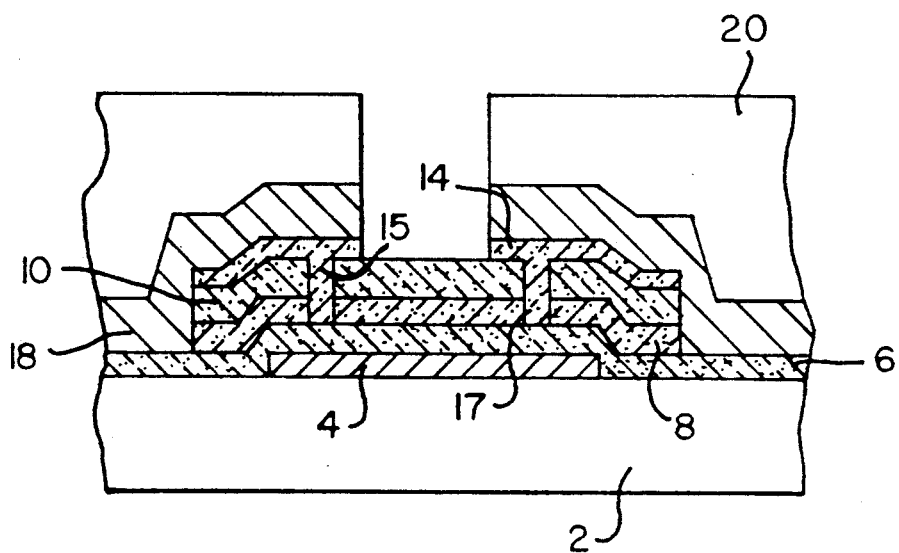
FIG. 4 is a cross-sectional view of the deposition of a conducting layer and etching of the conducting layer and the n+ a-Si layer to define a metal contact to the gate electrode at a location not visible in the cross-sectional view of FIG. 4, and to define source and drain metal contacts in a fourth step in accordance with the invention.

After the photoresist layer 12 is removed, an ohmic contact layer 14 of amorphous silicon doped with an n or p conductive-type dopant, such as n+ amorphous silicon having a thickness of 50 nm, for example, is deposited on the entire structure. This n+ type amorphous silicon layer 14 is deposited by the same technique as used for the a-Si:H layer 8, except that the reaction gases are now a mixture of silane and phosphine. This permits the creation of narrow ohmic contact regions 15, 17 for the source and drain of the transistor. The layer 14 is then covered with a photoresist layer 16. The contact regions 15 and 17 are coplanar with the active layer 8 and are very narrow to reduce parasitic capacitance. As shown in FIG. 3, the active region (thin oxide region) of the transistor is produced by classical photolithography methods. The n+ a-Si:H, SiN and a-Si:H layers are etched by dry etching; the reactive gases of each layer are sulfur hexafluoride, freon 23, and sulfur hexafluoride, respectively. The contact hole of the gate is opened at a location away from the active region between the source and drain. While this is not visible in the cross-sectional view of FIG. 3, it will be understood that it may be accomplished by the methods of classical photolithography. The gate insulating layer is etched by dry etching; the same technique is used for etching the passivation layer. A conducting layer 18 having a thickness, for example, of 500 nm, is deposited by vacuum evaporation or sputtering. A photoresist layer 20 is deposited on the top conductive layer 18.

Figure 5:
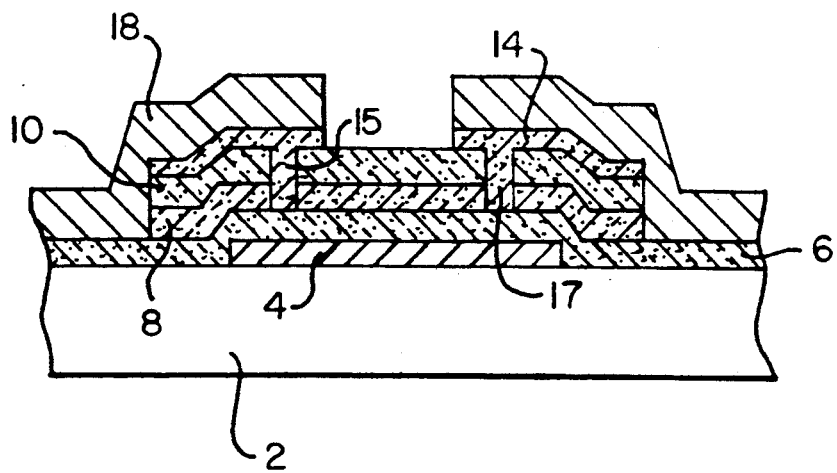
FIG. 5 is a cross-sectional view of the thin film transistor after removing the photoresist layer in accordance with the invention.

The source, drain and gate electrodes of the transistor are produced by classical photolithography methods. The conductive metal 18 is etched by wet etching, and the n+ amorphous silicon layer 14 between the source and drain electrodes of the transistor is etched by dry etching, i.e., the same technique as used previously for etching the active layer 8. The photoresist layer 20 is now removed, as shown in FIG. 5.

The process described above, due to the successive growth of the gate insulating layer, active layer, and the top passivation layer, results in the provision of contamination-free interfaces on both sides of the active layer 8.

The process further provides an "electrically" coplanar structure, in which the channel of the transistor and the drain and source electrodes are situated in the same plane, hence permitting the areas of the source and drain to be very small. The parasitic capacitance and contact resistance, which are caused by the overlap area of the gate and source or drain regions, can be drastically reduced.

While the invention has been disclosed and described with reference to a single embodiment, it will be apparent that variations and modifications may be made therein, and it is therefore intended in the following claims to cover each such variation and modification as falls within the true spirit and scope of the invention.

What is claimed is:

1. A process for producing an inverted coplanar thin film transistor, comprising:
   (a) forming a gate for the transistor on a substrate, the gate having a top surface defined between edges;
   (b) depositing gate insulating, hydrogenated amorphous silicon, and top passivation layers successively on the substrate;
   (c) depositing and developing a photoresist layer on the top passivation layer to open source and drain windows in the photoresist layer;
   (d) etching the top passivation layer until two portions of the hydrogenated amorphous silicon layer are exposed;
   (e) etching the exposed two portions of the hydrogenated amorphous silicon layer until two portions of the gate insulating layer are exposed to form a source opening and a drain opening in the amorphous silicon layer, said source opening and drain opening each extending from the top of the top passivation layer to the bottom of the hydrogenated amorphous silicon layer, each of the openings extending between two side walls which face each other, both the top passivation layer and hydrogenated amorphous silicon layer being at both of the side walls of each of the openings, the openings each having a bottom at which is said gate insulating layer so that a projection of each of said bottoms onto said top surface is spaced from said edges of said gate;
   (f) removing the remaining photoresist; and
   (G) forming source and drain ohmic contact regions in said source and drain openings in said hydrogenated amorphous silicon layer.

2. The process for producing a thin film transistor of claim 1, comprising forming the gate insulating layer of silicon nitride.

3. The process for producing a thin film transistor of claim 1, comprising forming the gate insulating layer of silicon oxide.

4. The process for producing a thin film transistor of claim 1 comprising forming the top passivation layer of silicon nitride.

5. The process for producing a thin film transistor of claim 1 comprising forming the top passivation layer of silicon oxide.

6. The process for producing a thin film transistor of claim 1 comprising etching the top passivation layer by dry etching.

7. The process for producing a thin film transistor of claim 1 comprising etching the hydrogenated amorphous silicon layer by dry etching.

8. The process for producing a thin film transistor of claim 1 wherein the step (S) includes depositing a conductive-doped amorphous silicon layer.

9. The process for producing a thin film transistor of claim 8 wherein said source and drain ohmic contact regions define an active region therebetween, said process further comprising:
   (h) depositing, exposing and developing a photoresist layer on the active region;
   (i) etching the conductive-doped amorphous silicon layer, the top passivation layer, and the hydrogenated amorphous silicon layer until a portion of the gate insulating layer outside the active region is exposed;
   (j) removing the photoresist layer;
   (k) depositing, exposing and developing a second photoresist layer on the gate insulating layer;
   (l) etching the gate insulating layer through the second photoresist layer until a metal contact region of the gate is exposed;
   (m) removing the remaining second photoresist layer;
   (n) depositing contact metal;
   (o) depositing and developing a third photoresist layer on the contact metal;
   (p) etching the contact metal through the third photoresist layer to form the connection of the gate and to form source/drain contact electrodes and successively etching the conductive-doped amorphous silicon layer between source and drain until the top passivation layer is exposed; and
   (q) removing the residual third photoresist layer.

10. A process for producing an inverted coplanar thin film transistor, comprising the steps of:
    (a) forming a layered structure comprising a substrate, a gate on the substrate, successive layers on the substrate and gate, the successive layers constituting a gate insulating layer, a hydrogenated amorphous silicon layer and a top passivation layer, the gate having a top surface facing the gate insulating layer and having edges which define the top surface; and
    (b) forming a source and a drain ohmic contact region in respective openings through the hydrogenated amorphous silicon and top passivation layers, each of the openings extending between two side walls which face each other, both the top passivation layer and the hydrogenated amorphous silicon layer being at both of the side walls of each of the openings, the openings each having a respective bottom at which is the gate insulating layer so that a projection of each of the bottoms onto the top surface is spaced from the edges of the gate.

11. A process as in claim 10, wherein the step of forming a source and a drain ohmic contact region includes providing doped amorphous silicon in the openings.

12. An inverted coplanar thin transistor, comprising:
    a layered structure comprising a substrate, a gate on the substrate, successive layers on the substrate and gate constituting a gate insulating layer, a hydrogenated amorphous silicon layer and a top passivation layer, the gate having a top surface facing the gate insulating layer and having edges which define the top surface; and
    a source and a drain ohmic contact region each in a respective opening through the hydrogenated amorphous silicon and top passivation layers, each of the openings extending between two side walls which face each other, both the top passivation layer and the hydrogenated amorphous silicon layer being at both of the side walls of each of the openings, the openings each having a respective bottom at which is the gate insulating layer so that a projection of each of the bottoms onto the top surface is spaced from the edges of the gate.

13. A structure as in claim 12, wherein the ohmic contact region is doped amorphous silicon.

14. A process for producing an inverted coplanar thin film transistor, comprising the steps of:

(a) forming a layered structure comprising a substrate, a gate on the substrate, successive layers on the substrate and gate, the successive layers constituting a gate insulating layer, a hydrogenated amorphous silicon layer and a top passivation layer, the hydrogenated amorphous silicon and top passivation layers having two openings each extending between a respective two side walls which face each other, both the top passivation layer and the hydrogenated amorphous silicon layer being at both of the side walls of each of the openings, the gate having a top surface and having edges which define the top surface, the openings each having a respective bottom at which is the gate insulating layer so that a projection of each of the bottoms onto the top surface is spaced from the edges of the gate; and (b) forming a source and a drain ohmic contact region, the source ohmic contact region being in one of the openings and the drain ohmic contact region being in the other of the openings.

* * * * *